Aug. 2, 1966 E. P. McGROGAN, JR 3,264,488
BALANCED CURRENT PUMPED PARAMETRIC CONVERTER
Filed Dec. 10, 1964
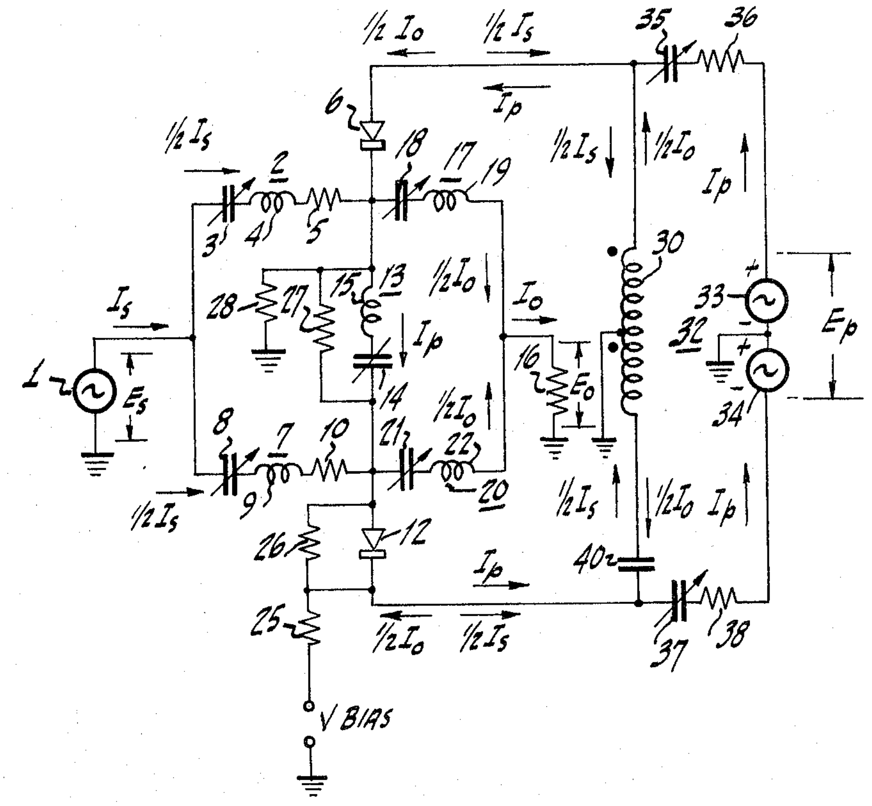
INVENTOR.
ELLWOOD P. McGROGAN, JR.
BY
Edward J. Norton
Attorney United States Patent Office 3,264,488
Patented August 2, 1966

3,264,488
BALANCED CURRENT PUMPED PARAMETRIC CONVERTER

Ellwood P. McGrogan, Jr., Cherry Hill, N.J., assignor to Radio Corporation of America, a corporation of Delaware Filed Dec. 10, 1964, Ser. No. 417,270
7 Claims. (Cl. 307—88.3)

This invention relates to parametric converters and particularly to an improved current pumped parametric converter circuit.

Current pumped parametric converter circuits which are known to the prior art generally rely solely upon the selectivity of tuned circuits to isolate the various frequency components which exist in the converter. For example, a typical current pumped converter includes a parametric element such as a variable capacitance diode which is supplied a signal current at a first frequency through a series resonant circuit tuned to the signal frequency. A pump current at a second frequency is supplied to the parametric element through a second series resonant circuit tuned to the pump frequency. Output current is taken from the parametric device and is supplied to a load impedance through another series resonant circuit tuned to the output frequency which will generally be either the sum or difference of the signal and pump frequencies. Where any two of these three frequencies, i.e. signal, pump and output, are closely spaced, isolation of the current paths for the currents at these two frequencies is difficult due to inadequate selectivity of the resonant circuits.

The result of this insufficient isolation is low conversion efficiency because the various frequency currents dissipate power in circuits from which the currents should be isolated. Trap circuits have been employed in the conventional converter circuits to increase isolation but these do not provide sufficient isolation for all applications. Where the converter must operate over a certain broad band of frequencies, the isolation problem becomes particularly acute because the tuned circuits must be broad band.

It is an object of the present invention to provide a current pumped parametric converter which provides good frequency isolation between the various current paths in the converter.

It is a further object of the present invention to provide a current pumped parametric converter which does not rely solely on the selectivity of its tuned circuits to isolate the various frequency signals.

It is a further object of the present invention to provide a tunable parametric converter operable over a broad band of frequencies with a high degree of frequency isolation.

The above objects are accomplished in the present invention by employing a novel balancing technique to isolate the various frequency current components in the converter circuit.

Briefly, two nonlinear parametric elements are connected in a circuit in which the current paths which it is desired to isolate are balanced with respect to each other. In order to balance the two current paths, one of the current paths is connected in a push-pull relationship with the two parametric elements while the other current path is connected in a push-push relationship. For example, where it is desired to isolate the pump circuit from both the input signal circuit and the output circuit, then, in one embodiment the pump source is connected to the two parametric elements in a push-pull circuit while the input signal source and the load are connected to the two parametric elements in push-push circuits. The circuit configuration of the present invention ensures that the current supplied to the two parametric elements in push-push is linearly divided, half flowing in each diode. This linear division provides efficient conversion and proper balancing. With the current paths properly balanced, the current component paths are effectively isolated from each other even where the selectivities of the tuned circuits are not sufficient to provide the desired isolation.

A more detailed description of one embodiment of the invention will be given with reference to the accompanying drawing in which the one figure is a circuit diagram of one embodiment of the present invention.

Referring to the figure, an input signal $E_s$, which is to be converted to a higher frequency, is coupled from an input source 1, one side of which is connected to a point at zero reference potential or ground, through a first series tuned circuit 2 comprising a variable capacitor 3, an inductor 4, and a resistor 5 to the cathode of an abrupt junction variable capacitance diode 6. The source 1 is also coupled through a second series tuned circuit 7, identical to the first tuned circuit 2, comprising a variable capacitor 8, an inductor 9, and a resistor 10 to the anode of a second abrupt junction variable capacitance diode 12 similar to the first diode 6. The two tuned circuits 2 and 7 are tuned to resonate the signal loop at the frequency of the input signal $E_s$. The abrupt junction diodes 6 and 12 offer the advantage of linear mixing due to a linear charge-elastance characteristic. Other types of parametric diodes may of course be used.

A third series tuned circuit 13 comprising a variable capacitor 14 and an inductor 15 tuned to series resonance at the pump frequency is connected between the cathode of the diode 6 and the anode of the diode 12. The pump frequency in this embodiment is assumed to be equal to the sum of the input signal frequency and the desired output frequency.

The cathode of the variable capacitance diode 6 is coupled to one end of an output load resistor 16 through a fourth series tuned circuit 17 comprising a variable capacitor 18 and an inductor 19. Similarly, the anode of the variable capacitance diode 12 is coupled to the same end of the load resistor 16 through a fifth series tuned circuit 20 comprising a variable capacitor 21 and an inductor 22. The other end of the load resistor 16, across which the output signal $E_o$ appears, is connected to a point at zero reference potential. The fourth and fifth tuned circuits 17 and 20 are tuned to resonate the output loops at the frequency of the output signal $E_o$ which, in the present case, is assumed to be equal to the difference in frequency between that of the pump and input signals.

A biasing network for the two variable capacitance diodes 6 and 12 comprises a first resistor 25 connected between a voltage source (not shown), which supplies a suitable bias voltage, and the cathode of the variable capacitance diode 12, a second resistor 26 connected across the variable capacitance diode 12, a third resistor 27 connected between the anode of the variable capacitance diode 12 and the cathode of the variable capacitance diode 6 and a fourth resistor 28 connected between the cathode of the variable capacitance diode 6 and a point of zero reference potential. The particular values of the four biasing resistors 25, 26, 27, and 28 will depend on the circuit requirements and the particular diodes used.

A transformer 30 is connected between the anode of the diode 6 and the cathode of the diode 12. The transformer 30 is a closely coupled iron or ferrite core autotransformer, the center tap of which is connected to a point of zero reference potential. A capacitor 40 is connected between the junction of resistors 25, 26 and the transformer 30 to prevent a D.C. connection from the junction of the two resistors 25 and 26 to the point of reference potential. While an iron or ferrite core transformer is shown, an air core transformer may be used at very high frequencies. The two halves of the transformer 30 are similar.

Current at the pump frequency is supplied to the two diodes 6 and 12 from a pump source 32 connected in a push-pull configuration. The source 32, illustrated as two sources 33 and 34 connected to a point of zero reference potential at the midpoint, may for example include a balanced transformer. The source 32 is connected to each of the two diodes 6 and 12 through two similar impedance matching circuits; the first comprising a variable capacitor 35 and a current limiting resistor 36 and the second comprising a variable capacitor 37 and a current limiting resistor 38. Other forms of impedance matching can also be used. The polarities of the two sources 33 and 34 are such that the magnitude of the voltage $E_p$ appearing across the two of them is equal to the sum of the magnitude of the voltages generated by each of them.

The operation of the balanced current pumped parametric converter may best be demonstrated by first considering the current paths of the three different frequency currents which exist in the converter. Consider first the input current $I_s$ supplied from the input source 1. The source 1 is connected in a push-push configuration with respect to the two diodes 6 and 12. The two series tuned circuits 2 and 7 coupling the source 1 to the two diodes 6 and 12 are tuned to resonance at the frequency of the input signal $E_s$. The third, fourth and fifth tuned circuits 13, 17, and 20 are tuned to resonate their respective loops at frequencies relatively high compared to the input frequency; the third circuit 13 being tuned to the pump frequency and the fourth and fifth circuits being tuned to the output frequency. Therefore, the impedances of these three circuits 13, 17, and 20 are very high at the input frequency. Thus, the input current $I_s$ is equally divided, one half flowing through each of the tuned circuits 2 and 7. The two halves then flow through the respective diodes 6 and 12 and return to the point of zero reference potential through the autotransformer 30. It should be noted that proper converter operation requires this linear division of input current between the two diodes 6 and 12. A nonlinear division would cause unwanted frequency components. The flux produced in the autotransformer 30 by one half of the input current $I_s$ returning to ground is canceled by an equal but opposite flux produced in the transformer 30 by the other half of the input current returning to ground. Thus, there is no voltage at the input frequency developed across either side of the autotransformer 30 nor between the two ends of the transformer 30. Therefore, no input current can flow in the circuit including the pump source 32 connected across the transformer 30 and the pump circuit is therefore isolated from the input current.

Pump current, $I_p$, is supplied in a push-pull arrangement from the source 32 to the two diodes 6 and 12 through the two variable capacitors 35 and 37, the two current limiting resistors 36 and 38 and the third series tuned circuit 13. The third series tuned circuit 13 comprising the variable capacitor 14 and the inductor 15 is tuned to resonate the pump loop at the pump frequency. With the pump circuit thus connected, the pump current $I_p$ flows through each of the two diodes 6 and 12. No current at the pump frequency can flow in the output resistor 16 because of the balanced nature of the pump circuit. Any current at the pump frequency which might tend to flow through the circuit 17 and the output resistor 16 is opposed by an equal but opposite current tending to flow in the circuit 20. Thus, while the selectivity of the two tuned circuits 17 and 20 may not be sufficient to isolate the pump current from the output circuit, the balanced nature of the circuit does accomplish this isolation. Moreover, the balanced nature of the circuit prevents pump current from flowing in the input circuit although in general the selectivity of the tuned input circuits 2, 7 is sufficient to accomplish the required isolation. This additional isolation may be needed in receivers having a stringent requirement on local oscillator radiation.

The combination of the input current and pump current in each parametric diode produces by parametric action an output current $I_o$ the frequency of which is equal to the difference in the frequencies of the pump current $I_p$ and input current $I_s$ in accordance with conventional parametric conversion. The output current path is shown in the figure. Output current generated by the two diodes 6 and 12 flows through the tuned circuits 17 and 20, which tune the output loops to the output frequency, through the output resistor 16 and through the autotransformer 30. Because half of the output current flows in each half of the autotransformer 30 the total flux at the output frequency is zero and no voltage at the output frequency appears either across the separate sides of the transformer 30 or across the entire transformer 30. Therefore, no output current is lost in that part of the pump circuit including the pump source 32 connected across the transformer 30.

Consider the use of the present up converter in the front end of a high frequency receiver. Assume that the converter is to perform the functions of selecting one of a plurality of information channels, each 25 kilocycles wide and spaced between two and three megacycles, which are supplied by the source 1 to the converter and converting the selected channel to a frequency of 31 megacycles. In such a case each of the two series tuned circuits 2 and 7 which couple the input source 1 to the two variable capacitance diodes 6 and 12 have one megacycle bandwidth between two and three megacycles. The two series tuned circuits 17 and 20 coupling the variable capacitance diodes 6 and 12 to the output resistor 16 are tuned to 31 megacycles with a bandwidth sufficient to pass the signal of 25 kilocycle bandwidth. In most cases it will be desirable to place a 31 mc. crystal filter with a 25 kc. bandwidth after the load resistor 16 in order to precisely limit the output frequency. The pump source 32 in this case is frequency variable between 33 and 34 megacycles. Therefore, the tuned circuit 13 will have a one megacycle bandwidth between 33 and 34 megacycles. By varying the frequency of the pump current, the desired input signal is converted to the 31 mc. output signal by parametric conversion, the output frequency being the difference between the pump frequency and the input signal frequency.

The balanced nature of the circuit will provide the required isolation between the pump circuit and the output circuit. Thus, even though the frequencies of the pump and the output are very close together the pump being variable between 33 and 34 megacycles and the output being tuned to 31 megacycles, negligible pump power is lost in the output circuit and negligible output power is lost in the pump circuit.

While in the specific embodiment described, the input and output circuits were connected in push-push and the pump circuits in push-pull, it should be noted that the technique of the present invention is not limited to this configuration. In general all that is required to accomplish isolation is that the two circuits which it is desired to isolate from one another be balanced with respect to one another, i.e. one circuit connected in push-push and the second in push-pull and that current supplied to the diodes in push-push be linearly divided between the two diodes.

What is claimed is:

1. A balanced parametric converter comprising:

(a) first and second variable capacitance diodes, (b) means for coupling said variable capacitance diodes to a first source of current at a first frequency in a push-pull circuit forming a low impedance resonant loop at said first frequency, (c) means for coupling said variable capacitance diodes to a second source of current at a second frequency in a manner such that equal currents are caused to flow through said diodes irrespective of differences in the impedances of said first and second variable capacitance diodes, (d) circuit means for coupling said variable capacitance diodes to a load impedance in a push-push circuit with said circuit means permitting only a current at a third frequency which third frequency is different from said first frequency by at least said second frequency due to said first and second frequency currents flowing through said nonlinear capacitance diodes.

2. A balanced parametric converter comprising:

(a) first and second nonlinear reactance elements, (b) means forming a low impedance resonant loop at a first frequency coupled to said first and second nonlinear reactance elements for causing a current generated by a first source at said first frequency to flow through both of said nonlinear reactance elements, (c) means coupled to said first and second nonlinear reactance elements for causing current generated by a second source at a second frequency to be linearly divided irrespective of the differences in impedances of said first and second nonlinear reactance elements so that a first part of said divided current flows through said first nonlinear reactance element and the second part of said divided current flows through said second nonlinear reactance in a direction opposite to said current flow through said first nonlinear reactance element, (d) a load impedance, (e) means coupled to said nonlinear reactance elements and to said load impedance for causing a current to flow through said load impedance, which current is at a frequency different from said first frequency by said second frequency.

3. A balanced current pumped parametric converter comprising:

(a) first and second nonlinear reactance elements each having two terminals, (b) a first source of current at a first frequency, (c) a frequency selective network having two terminals and having a low impedance at said first frequency, one of said network's terminals being coupled to a terminal of said first nonlinear reactance and said network's other terminal being coupled to one of said second nonlinear reactance's terminals, (d) means for coupling said first source to said other terminals of said nonlinear reactance elements causing a current at said first frequency to flow through said network and said first and second nonlinear reactances, (e) a second source of current, (f) means for coupling said second source of current to one terminal of said first and second reactances causing equal currents at said second frequency to flow in opposite directions through said first and second nonlinear reactances, (g) output means including a load impedance coupled to said first and second nonlinear reactances causing a current to flow through said load impedance of a frequency which is different from said first frequency by at least said second frequency due to the parametric action of said nonlinear reactances.

4. A balanced current pumped parametric converter comprising:

(a) a pair of nonlinear reactance elements, (b) a first current path including a series connection of said nonlinear reactance elements and a series circuit resonant at a first frequency, said series resonant circuit being positioned between said elements, (c) means for supplying current at said first frequency through said current path, (d) means for supplying current at a second frequency to said nonlinear reactance elements in the same direction as said current of first frequency through one of said nonlinear reactances and in the opposite direction through said other nonlinear reactance, said currents at said second frequency being substantially equal in magnitude, (e) a load impedance, (f) output means coupling said load impedance to said nonlinear recactances to cause a current to flow through said load impedance at a frequency different from said first frequency by said second frequency, said last-mentioned current being substantially free of components of said first and second frequencies.

5. A balanced parametric converter comprising:

(a) a first nonlinear reactance element having first and second terminals, (b) a second nonlinear reactance element substantially the same as said first element having first and second terminals corresponding to said first and second terminals of said first element, (c) a first series tuned circuit, (d) means for connecting said first circuit between the first terminal of said first element and the second terminal of said second element, said first series tuned circuit being tuned to provide a low impedance path for current at a first frequency through said elements, (e) a center-tapped autotransformer having a first end coupled to the second terminal of said first element and a second end coupled to the first terminal of said second element and the center coupled to a point of zero reference potential, said transformer having a relatively high impedance at said first frequency, (f) means for coupling a source of electrical energy at said first frequency across said center-tapped autotransformer, (g) second and third tuned circuits each having first and second ends, said fourth and fifth circuits being connected together at their first ends, (h) means for coupling said second circuit at its second end to the first terminal of said first element and said third circuit at its second end to the second terminal of said second element, (i) means for coupling a source of electrical energy at a second frequency between said point of reference potential and the first ends of said second and third tuned circuits, said second and third circuits being tuned to provide a low impedance path for current at said second frequency through said elements, (j) fourth and fifth tuned circuits each having first and second ends, said fourth and fifth circuits being connected together at their first ends, (k) means for coupling the second end of said fourth circuit to the first terminal of said first element, (l) means for coupling the second end of said fifth circuit to the second terminal of said second element, (m) a load impedance, and (n) means for coupling said load impedance between said point of reference potential and the first ends of said fourth and fifth tuned circuits, said fourth and fifth circuits being tuned to provide a low impedance path at a third frequency between said elements and said load impedance, said third frequency being different from said first frequency by said second frequency.

6. A parametric converter as claimed in claim 5 wherein said first and second nonlinear reactance elements are variable capacitance diodes.

7. A balanced parametric converter comprising:

(a) a first variable capacitance diode having an anode and a cathode, (b) a second variable capacitance diode substantially the same as said first variable capacitance diode having an anode and a cathode, (c) a first series tuned circuit, (d) means for connecting said first circuit between the cathode of said first variable capacitance diode and the anode of said second variable capacitance diode said first series tuned circuit being tuned to provide a low impedance path for current at a first frequency through said variable capacitance diodes, (e) a center-tapped autotransformer having a first end coupled to the anode of said first variable capacitance diode and a second end coupled to the cathode of said second variable capacitance diode and the center coupled to a point of zero reference potential, said transformer having a relatively high impedance at said first frequency, (f) means for coupling a source of alternating electrical energy at said first frequency between the anode of said first variable capacitance diode and the cathode of said second variable capacitance diode, (g) second and third tuned cicuits each having first and second ends said fourth and fifth circuits being connected together at their first ends, (h) means for coupling said second circuit at its second end to the cathode of said first variable capacitance diode and said third circuit at its second end to the anode of said second variable capacitance diode, (i) means for coupling a source of alternating electrical energy at a second frequency between said point of reference potential and the first ends of said second and third tuned circuits said second and third circuits being tuned to provide a low impedance path for current at said second frequency through said parametric elements, (j) fourth and fifth tuned circuits each having first and second ends said foruth and fifth circuits being connected together at their first ends, (k) means for coupling the second end of said fourth circuit to the cathode of said first variable capacitance diode, (l) means for coupling the second end of said fifth circuit to the anode of said second variable capacitance diode, (m) a load impedance, (n) means for coupling said load impedance between said point of reference potential and the first ends of said fourth and fifth tuned circuits, said fourth and fifth circuits being tuned to provide a low impedance path at a third frequency between said variable capacitance diodes and said load impedance, said third frequency being different from said first frequency by said second frequency, and (o) means isolated for direct current from said sources of alternating electrical energy and said load impedance for applying a direct current bias voltage to said variable capacitance diode.

References Cited by the Examiner

UNITED STATES PATENTS

| | | | |
|---|---|---|---|
| 3,045,189 | 7/1962 | Engelbrecht | 307—88.3 |
| 3,105,941 | 10/1963 | Kliphuis | 330—4.9 |
| 3,144,615 | 8/1964 | Engelbrecht | 330—4.6 |

ROY LAKE, *Primary Examiner.*

D. R. HOSTETTER, *Assistant Examiner.*